(12) United States Patent
Chen et al.

(10) Patent No.: US 9,841,487 B2
(45) Date of Patent: Dec. 12, 2017

(54) CALIBRATION BOARD FOR CALIBRATING SIGNAL DELAYS OF TEST CHANNELS IN AN AUTOMATIC TEST EQUIPMENT AND TIMING CALIBRATION METHOD THEREOF

(71) Applicant: CHROMA ATE INC., Taoyuan (TW)

(72) Inventors: Hou-Chun Chen, Taoyuan (TW);
Shin-Wen Lin, Taoyuan (TW);
Ching-Hua Chu, Taoyuan (TW);
Po-Kai Cheng, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 97 days.

(21) Appl. No.: 14/928,062

(22) Filed: Oct. 30, 2015

(65) Prior Publication Data

US 2016/0124066 A1 May 5, 2016

(30) Foreign Application Priority Data

Oct. 31, 2014 (TW) .............................. 103137909 A

(51) Int. Cl.
*G01R 31/00* (2006.01)
*G01R 35/00* (2006.01)
*G01R 31/28* (2006.01)

(52) U.S. Cl.
CPC ....... *G01R 35/005* (2013.01); *G01R 31/2834* (2013.01); *G01R 31/2882* (2013.01)

(58) Field of Classification Search
CPC .............. G01R 35/005; G01R 31/3191; G01R 31/31937; G01R 31/31922;

(Continued)

(56) References Cited

U.S. PATENT DOCUMENTS

| 5,262,716 A * | 11/1993 | Gregory, Jr. ..... | G01R 31/31905 |
| | | | 324/73.1 |
| 7,623,979 B2 * | 11/2009 | Visser ................ | G01R 31/2822 |
| | | | 702/85 |
| 8,692,538 B2 * | 4/2014 | Phillips .............. | G01R 31/3191 |
| | | | 324/74 |

FOREIGN PATENT DOCUMENTS

| JP | 2000314764 A | 11/2000 |
| JP | 2003043124 A | 2/2003 |

(Continued)

OTHER PUBLICATIONS

JPO, "Office Action", dated Nov. 1, 2016, Japan.

*Primary Examiner* — Vinh Nguyen
(74) *Attorney, Agent, or Firm* — Locke Lord LLP; Tim Tingkang Xia, Esq.

(57) ABSTRACT

A calibration board and a timing calibration method thereof are provided. The calibration board for calibrating signal delays of test channels in an automatic test equipment is pluggably disposed in the automatic test equipment and includes calibration groups, a first common node, and a switching module. Each calibration group includes a second common node and conductive pads electrically connecting to the second common node. Each conductive pad selectively and electrically connects to one test channel. The switching module electrically connects to the first common node and each second common node. When a first delay calibration procedure is performed, the connection between the first common node and each second common node is disabled. When a second delay calibration procedure is performed, the connection between the first common node and each second common node is built.

8 Claims, 6 Drawing Sheets

(58) Field of Classification Search
CPC .......... G01R 31/2834; G01R 31/31725; G01R 19/2513; G01R 31/2882; G01R 31/3016; G01R 31/31717; G01R 31/319; G01R 31/3193; G01R 35/00; H04N 2201/04794; H04B 17/11; H04B 17/21; G06F 1/10; G11B 20/1816; G11B 27/36; G11C 29/56; H03K 5/135
See application file for complete search history.

(56) References Cited

FOREIGN PATENT DOCUMENTS

| | | | |
|---|---|---|---|
| JP | 2011089857 | A | 5/2011 |
| JP | 2014516167 | A | 7/2014 |
| WO | 02101404 | A1 | 12/2002 |
| WO | 2007072738 | A1 | 6/2007 |
| WO | 2011001463 | A1 | 1/2011 |

\* cited by examiner

CALIBRATION BOARD FOR CALIBRATING SIGNAL DELAYS OF TEST CHANNELS IN AN AUTOMATIC TEST EQUIPMENT AND TIMING CALIBRATION METHOD THEREOF

CROSS-REFERENCE TO RELATED APPLICATIONS

This non-provisional application claims priority under 35 U.S.C. §119(a) on Patent Application No. 103137909 filed in Taiwan, R.O.C. on Oct. 31, 2014, the entire contents of which are hereby incorporated by reference.

BACKGROUND

Technical Field

The present disclosure relates to an automatic test equipment, particularly relates to a calibration board pluggably disposed in the automatic test equipment and a timing calibration method thereof for calibrating signal delays in testing channels of the automatic test equipment.

Description of the Related Art

The automatic test equipment allows the semiconductor device manufactures to massively test the functions of every component in the market. Generally, the automatic test equipment outputs a driving signal to a component to be tested and detects the feedback signal from the component, and compares the detected value with the expected value.

The current semiconductor components usually include hundreds to thousands pins to receive and send lots of input or output signals. Because each pin corresponds to one function to be tested, the automatic test equipment is able to test a plurality functions corresponding to the pins of the semiconductor component to be tested through a plurality of function boards.

However, the lengths of the signal paths between the function boards and the pins of the semiconductor component to be tested are different and different lengths result in signal transmission delay between the function boards and the pins of the semiconductor component to be tested, wherein the signal paths refer to the channels. Therefore, the automatic test equipment calibrates signal delays between the function boards and the pins of the semiconductor component to be tested before testing the semiconductor component to be tested.

In addition, the selections of the channels corresponding to the pins are performed by the array consisting of a plurality of switching components. Therefore, the more switching components are needed when there are more channels. Thus, an effective and low cost calibration board and timing calibration method are needed.

SUMMARY

A calibration board pluggably disposed in an automatic test equipment for calibrating signal delays of a plurality of testing channels in the automatic test equipment includes a first common node, a plurality of calibration groups, and a switching module. Each of the plurality of calibration groups includes a second common node and a plurality of conductive pads. Each of the plurality of conductive pads is electrically connected to the second common node and each of the plurality of conductive pads is for being electrically connected to one of the plurality of testing channels selectively. The switching module is connected between the first common node and the plurality of second common nodes. When a first delay calibration procedure is performed, the switching module disconnects connections between the first common node and the plurality of second common nodes. When a second delay calibration procedure is performed, the switching module builds connections between the first common node and the plurality of second common nodes.

A timing calibration method for an automatic test equipment is provided. The automatic test equipment includes a plurality of testing channels and a pluggable calibration board, and the calibration board includes a plurality of calibration groups, a first common node, and a switching module, and each of the plurality of calibration groups includes a second common node and a plurality of conductive pads electrically connected to the second common node, and each of the plurality of conductive pads is electrically connected to one of the plurality of testing channels selectively, and the switching module is connected between the first common node and the plurality of second common nodes. The method includes when a first delay calibration procedure is performed and the switching module disconnects connections between the first common node and the plurality of second common nodes, detecting signal delays between the plurality of testing channels in the same calibration group to synchronize the plurality of testing channels in the same calibration group, and when a second delay calibration procedure is performed and the switching module builds connections between the first common node and the plurality of second common nodes, detecting signal delays between the plurality of calibration groups to synchronize the plurality of calibration groups.

The calibration board and the timing calibration method of the present disclosure group the pins of the electronic device to be tested and the corresponding testing channels to form a plurality of calibration groups. Next, the first delay calibration procedure is performed to detect and calibrate signal delays of a plurality of testing channels in the same calibration group. The second delay calibration procedure is performed to detect and calibrate signal delays of the plurality of calibration groups. Therefore, transmission delays and reception delays of signal transmission in the plurality of testing channels are effectively calibrated or compensated and the costs of the switching moduleing paths between each of the plurality of testing channels and the delay detector are reduced.

BRIEF DESCRIPTION OF THE DRAWINGS

The present disclosure will become more fully understood from the detailed description given hereinbelow and the accompanying drawings, which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
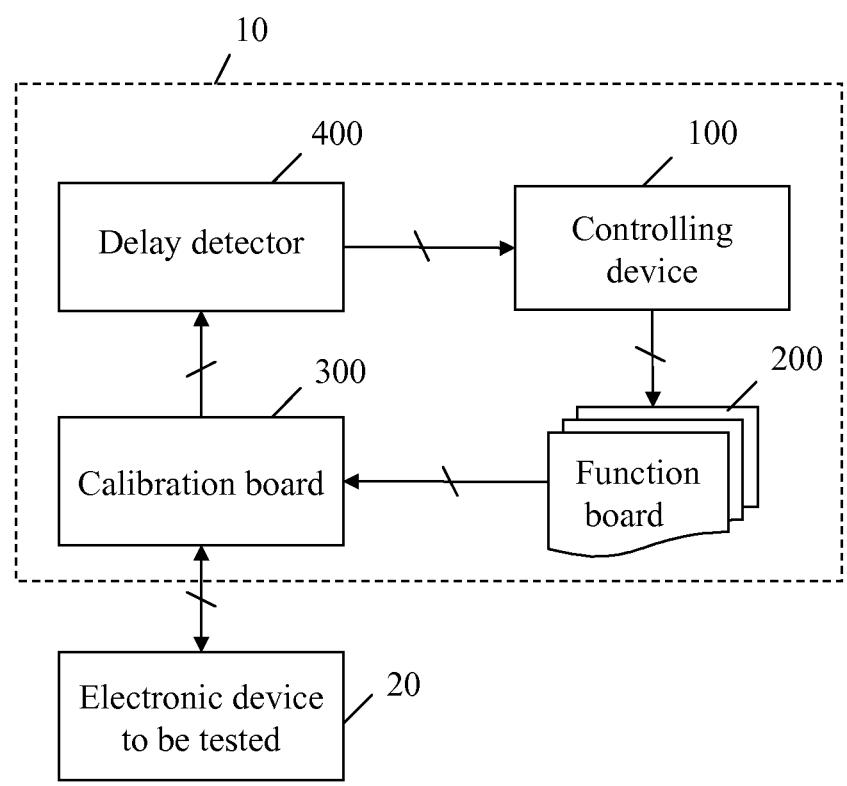
FIG. 1 is a block diagram of the automatic test equipment performing timing calibration according to an embodiment.

The present disclosure is related to an automatic test equipment. Please refer to FIG. 1. FIG. 1 is a block diagram of the automatic test equipment performing timing calibration according to an embodiment. As shown in FIG. 1, the automatic test equipment 10 is for testing one or a plurality of electronic devices to be tested 20, such as a Very large scale integration (VLSI) chip or other similar electronic device. Because the electronic device to be tested 20 includes a plurality of pins and each of the plurality of pins corresponds to a function to be tested, the automatic test equipment 10 tests the function to be tested corresponding to each of the plurality of pins of the electronic device to be tested 20 through the function board 200. For specifically explaining the operations of the automatic test equipment 10, an electronic device to be tested 20 is taken as an example as follows.

On the other hand, because the paths of the pins from each function board 200 to the electronic device to be tested 20 are different, and the differences of the paths result in signal transmission delay between the function boards and the electronic device to be tested 20, the automatic test equipment 10 calibrates or compensates the signal transmission of the transmission delays and the reception delays in each testing channel by the timing calibration method before testing the functions of the electronic device to be tested 20, wherein the testing channels are the paths of the pins from each function board 200 to the electronic device to be tested 20.

Therefore, as shown in FIG. 1, the automatic test equipment 10 at least includes a controlling device 100, one or a plurality of function boards 200, a calibration board 300, and a delay detector 400. The controlling device 100 is electrically connected to the plurality of function boards 200, and the plurality of function boards 200 are electrically connected to the calibration board 300, and the calibration board 300 is electrically connected to the electronic device to be tested 20 and the delay detector 400, and the delay detector 400 is electrically connected to the controlling device 100.

The controlling device 100 provides a plurality of sluts and each of the plurality of sluts is for plugging a function board 200, and the plugged function board 200 is electrically connected to the controlling device 100. The controlling device 100 is for driving each of the plurality of function boards 200 to send a testing signal to a pin corresponding to the electronic device to be tested 20, to receive a signal sent from the electronic device to be tested 20 for further analysis. On the other hand, the controlling device 100 controls the time of which each of the plurality of function boards 200 sends the testing signal according to the calibration value.

Figure 2:
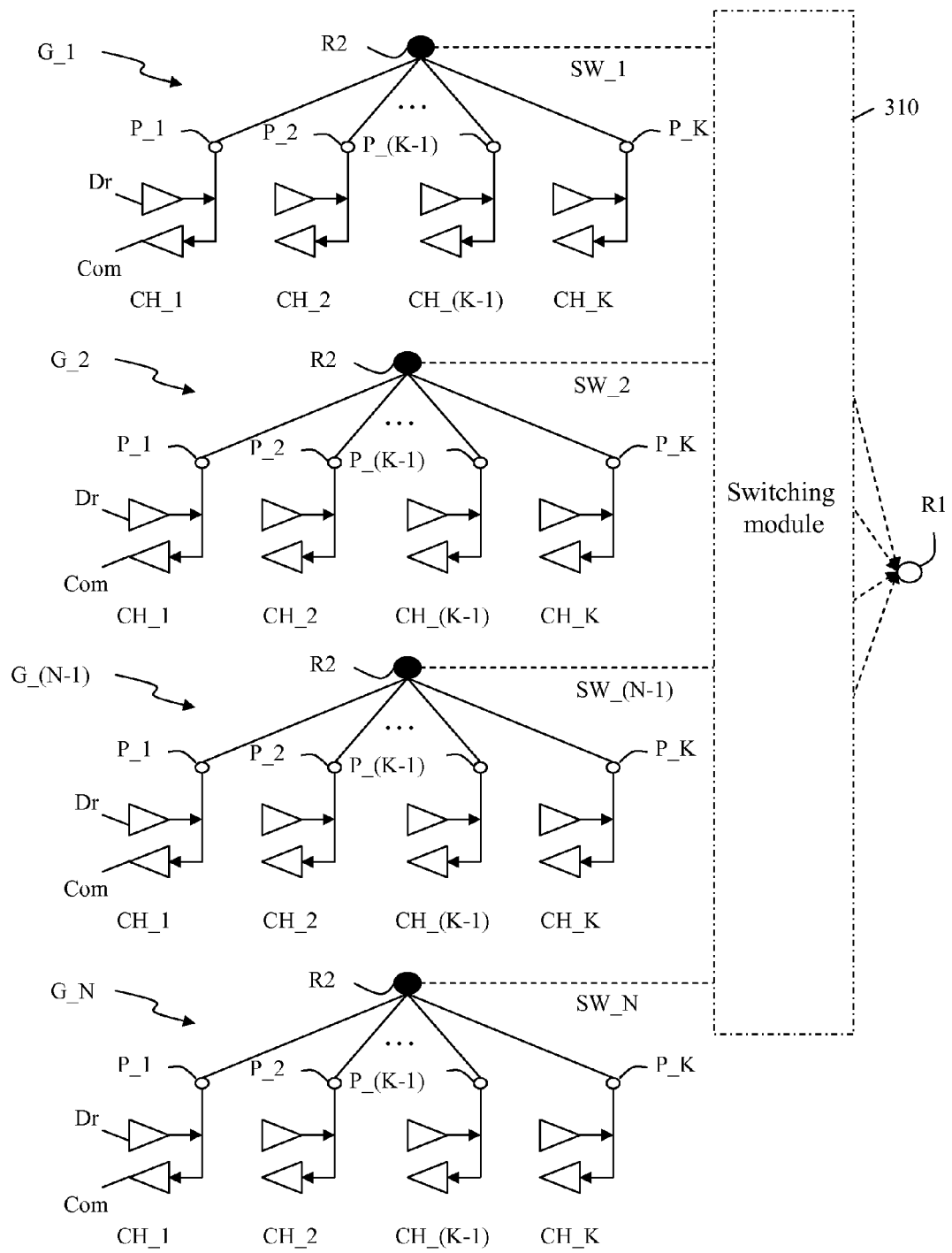
FIG. 2 is a structural diagram of the calibration board according to an embodiment.

The calibration board 300 is pluggably disposed in the automatic test equipment 10 for calibrating signal delays of the testing channels in the automatic test equipment 10. Please refer to FIG. 1 and FIG. 2 together. As shown in FIG. 1 and FIG. 2, the calibration board 300 includes a switching module 310, a plurality of calibration groups G_1~G_N, and a first common node R1. N is an integer greater than 2. Each of the plurality of calibration groups includes a second common node R2 and a plurality of conductive pads P_1~P_K. K is an integer greater than 2. In the same calibration group, the plurality of conductive pads P_1~P_K are selectively electrically connected to the testing channels CH_1~CH_K respectively and to the second common node R2. Assuming that when the electronic device to be tested 20 includes N×K pins, the N×K pins are one-to-one corresponding to N×K conductive pads. The second common node R2 is, for example, a short circuit.

The switching module 310 is electrically connected between the first common node R1 and each of the plurality of second common nodes R2. Therefore, all of the plurality of second common nodes R2 are selectively electrically connected to the first common node R1. In other words, the switching module 310 provides a plurality of switching paths SW_1~SW_N, and each of the plurality of switching paths selectively builds an electrical connection between one of the plurality of second common nodes R2 and the first common node R1. For example, the switching path SW_1 disconnects or builds the connection between the first common node R1 and the plurality of second common nodes R2 in the calibration group G_1. The switching module 310, for example, builds a switching path at a time. For example, when the switching path SW_1 is built, other switching paths SW_2~SW_N are disconnected. The order of building the switching paths SW_1~SW_N is set according to the practical needs. The switching module 310 is, for example, a switch array. The switch array is, for example, a relay array consisting of a plurality of relays, or an electronic switch array consisting of a plurality of electronic switches, such as diodes or transistors.

The single testing channel is a signal transmission channel between a function board 200 and one of the pins of the electronic device to be tested 20. Each of the plurality of testing channels includes a channel driver Dr and a channel comparator Com. The channel driver Dr is for outputting signals to the second common node R2 and the channel comparator Com at a time point, and outputting signals to the first common node R1 at another time point. The channel comparator Com is for receiving signals from the channel driver Dr at a time point, receiving signals from the second common node R2 at another time point to identify and send the receiving time of the received signals to the delay detector 400. On the other hand, when the switching module 310 builds one of the switching module paths, signals of any of the channel drivers Dr in the calibration group corresponding to the built switching path are sent to the delay detector 400 through the conductive pad corresponding to the channel driver Dr, the second common node R2, and the first common node R1. Accordingly, the delay detector 400 detects the delay condition of each of the plurality of testing channels according to the received time information and signals to notify the controlling device 100 to perform delay calibration. In an embodiment, the delay detector 400 is in the calibration board 300. In another embodiment, the delay detector 400 and the calibration board 300 are independent.

In addition, in the procedure of performing the timing calibration, the controlling device 100 performs the first delay calibration procedure to the calibration groups G_1~G_N respectively. In the first delay calibration procedure, the switching module 310 disconnects the connection between the first common node R1 and the second common node R2, and the delay detector 400 detects signal delays of the testing channels CH_1~CH_K in the same calibration group, so that the controlling device 100 synchronizes the testing channels CH_1~CH_K in the same calibration group according to the detection result of the delay detector 400.

Next, the controlling device 100 performs a second delay calibration procedure the plurality of calibration groups G_1~G_N. In the second delay calibration procedure, the switching module 310 builds the connection between the first common node R1 and the plurality of second common nodes R2, and the delay detector 400 detects signal delays between the plurality of calibration groups G_1~G_N, so that the controlling device 100 sequentially synchronizes the plurality of calibration groups G_1~G_N according to the detection result of the delay detector 400. The synchronization between the testing channels is that the signals transmitted in each testing channel reach the destination at the same time, and/or each testing channel receives the signal at the same time. The first delay calibration procedure and the second delay calibration procedure are specifically explained later.

Figure 3:
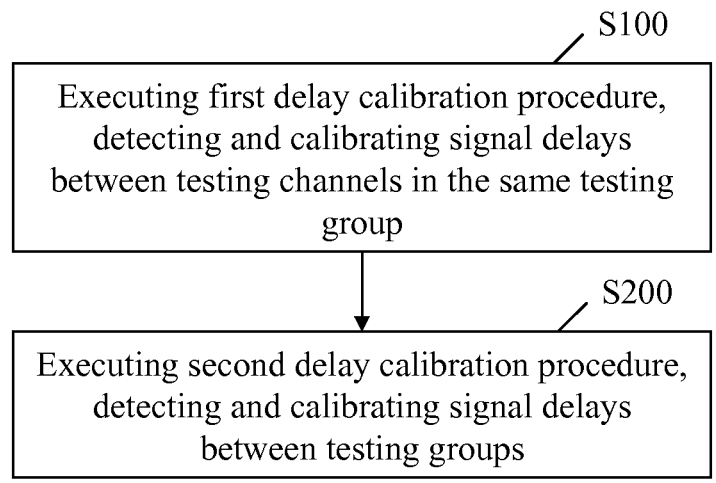
FIG. 3 is a flowchart of the timing calibration method according to an embodiment.

For specifically explaining how the automatic test equipment 10 performs the timing calibration method, please refer to FIG. 1 to FIG. 3. FIG. 3 is a flowchart of the timing calibration method according to an embodiment. The timing calibration method for the automatic test equipment 10 includes the following steps. In the step S100, a first delay calibration procedure is performed to the calibration groups G_1~G_N respectively to detect and calibrate signal delays of the testing channels CH_1~CH_K in the same calibration group. In the step S200, a second delay calibration procedure is performed to the calibration groups G_1~G_N to detect and calibrate signal delays of the calibration groups G_1~G_N.

Figure 4:
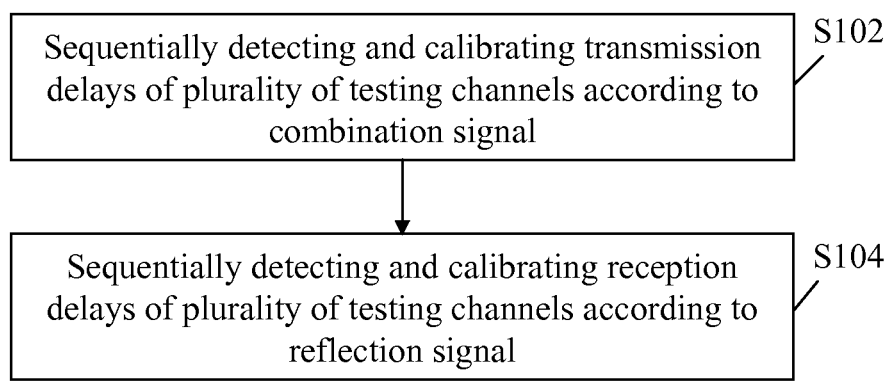
FIG. 4 is a flowchart of the first delay calibration procedure according to an embodiment.

In an embodiment of the step S100, the first delay calibration procedure is shown in FIG. 4. The first delay calibration procedure includes the following steps. In the step S102, reception delays of the testing channels CH_1~CH_K in the same calibration group is sequentially detected and calibrated according to a combination signal. The combination signal is generated from a first testing signal provided by part of the testing channels CH_1~CH_K. For example, the combination signal is generated from the first testing signal provided by the other testing channels CH_1~CH_K except the first channel to be tested. Assuming that the testing channel CH_1 in the testing group G_1 is the first channel to be tested, the combination signal is generated from the first testing signal provided by the other testing channels CH_2~CH_K, wherein the first testing signal is, for example, a pulse signal or a square signal.

Next, in the step S104, transmission delays of the plurality of testing channels CH_1~CH_K in the same calibration group is sequentially detected and calibrated according to a reflection signal. For example, assuming that the testing channel CH_1 in the testing group G_1 is the second channel to be tested, the reflection signal is obtained from the reflection of the second testing signal provided by the testing channel CH_1 in the testing group G_1, wherein the first testing signal is, for example, a pulse signal or a square signal.

Figure 5A:
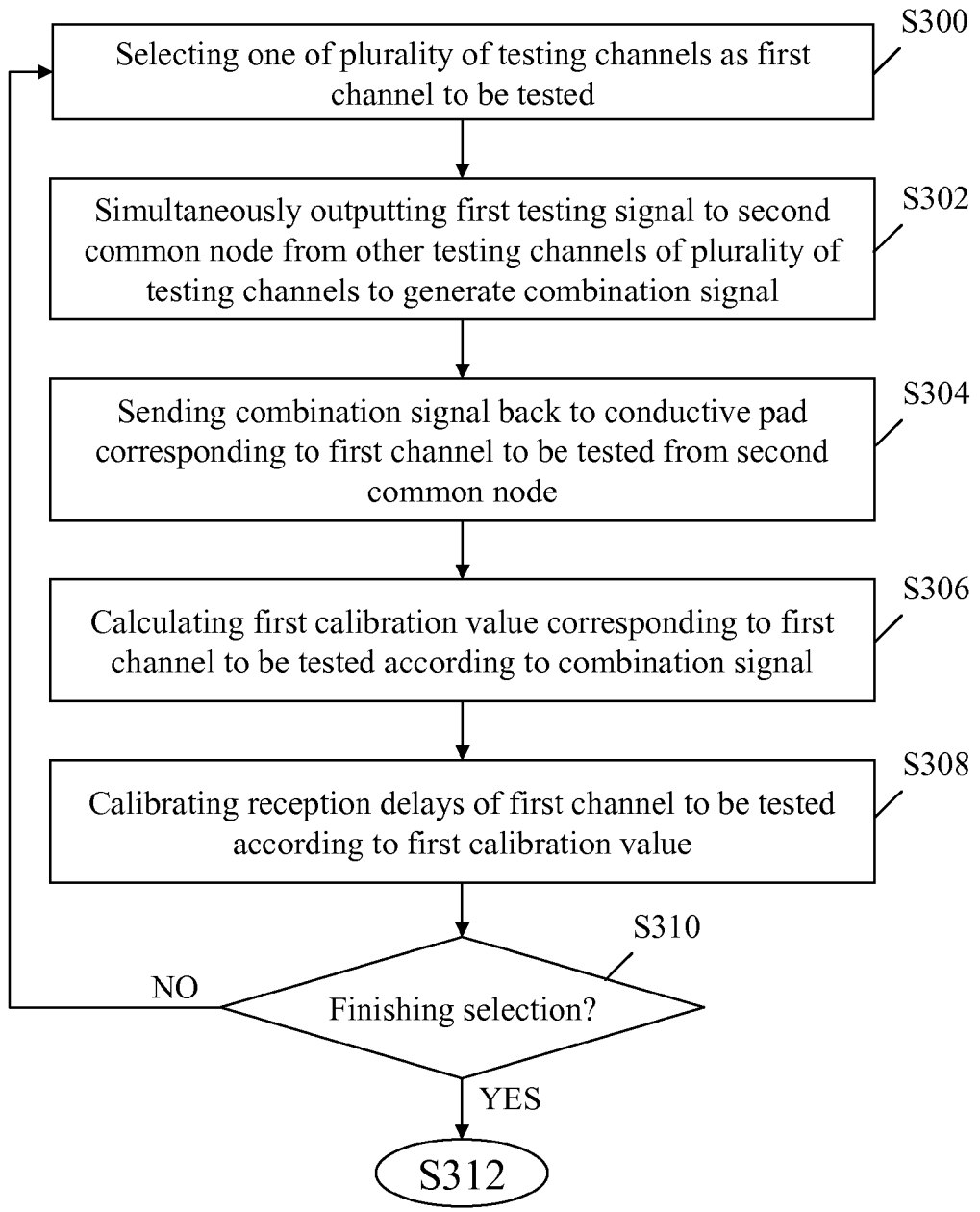
FIGS. 5A and 5B are flowcharts of the first delay calibration procedure according to another embodiment.
Figure 5B:
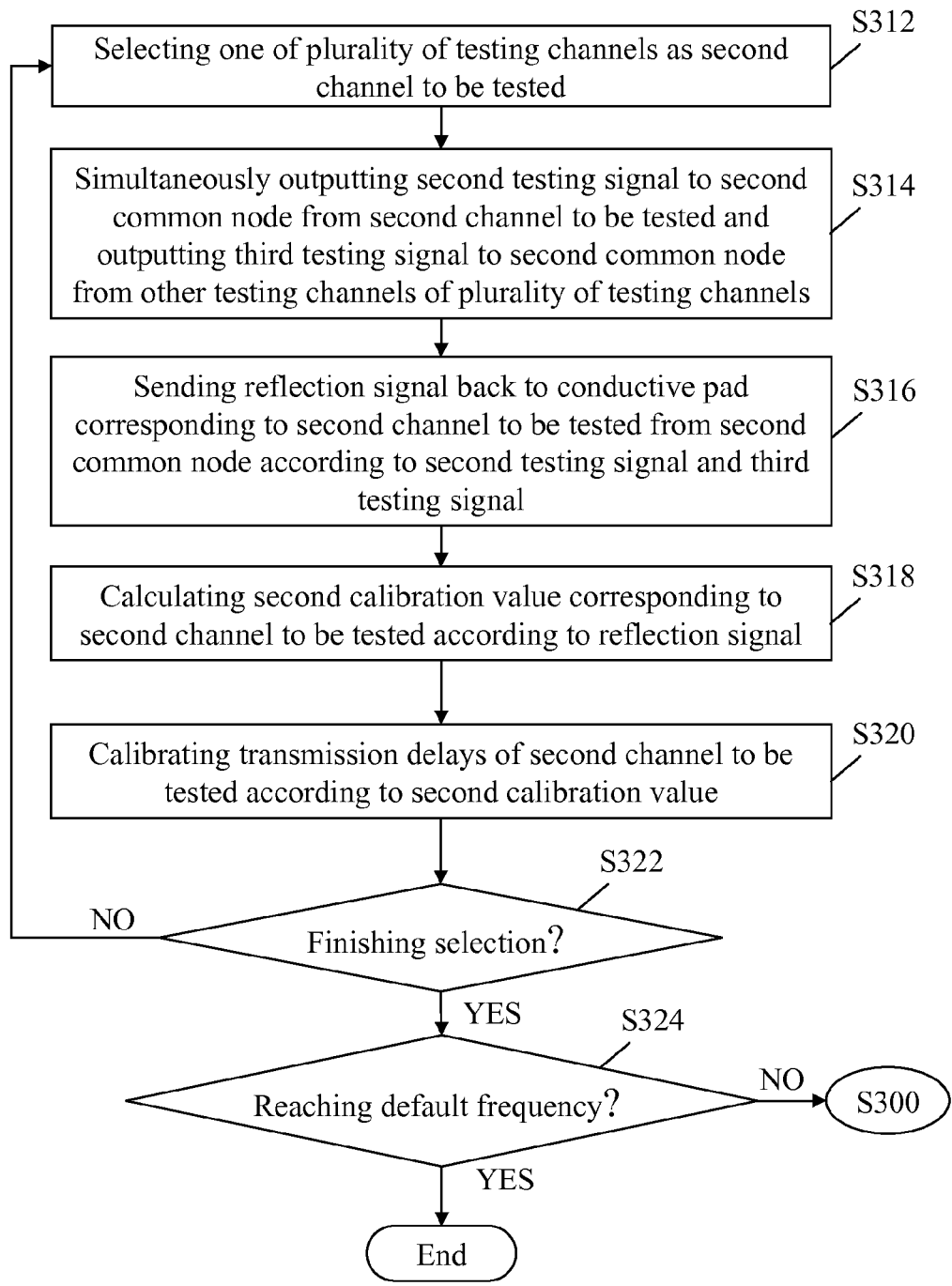

Please refer to FIG. 5A and FIG. 5B. FIGS. 5A and 5B are flowcharts of the first delay calibration procedure according to another embodiment. The steps S300 to S310 are a further embodiment of the step S102. The steps S312 to S320 are a further embodiment of the step S104. The first delay calibration procedure is explained following the order of the testing groups G_1~G_N and the order of the testing channels CH_1~CH_K to sequentially calibrate reception delays of the testing channels CH_1~CH_K of each testing groups for convenience.

In the step S300, the controlling device 100 selects one of the plurality testing channels CH_1~CH_K of one of plurality of testing groups as the first channel to be tested, wherein the selected testing group is, for example, the testing group G_1. In the step S302, other testing channels of the plurality of testing channels CH_1~CH_K except the first channel to be tested simultaneously provide the first testing signal to the second common node R2 to form the combination signal. In the step S304, the second common node R2 sends the combination signal to the conductive pad corresponding to the first channel to be tested. The delay detector 400 receives the combination signal through the conductive pad. In the step S306, the delay detector 400 calculates a first calibration value corresponding to the first channel to be tested according to the received combination signal. In the step S308, the delay detector 400 sends the first calibration value to the controlling device 100 to notify the controlling device 100 to calibrate reception delays of the first channel to be tested according to the first calibration value.

For example, when the automatic test equipment 10 calibrates the testing group G_1, the controlling device 100 selects the testing channel CH_1 in the testing group G_1 as the first channel to be tested and the conductive pad P_1 electrically connected to the testing channel CH_1 is the first target pad. Next, the controlling device 100 drives the channel driver Dr of the testing channels CH_2~CH_K to provide the first testing signal to the plurality of second common nodes R2 through the conductive pads P_2~P_K, wherein the first testing signal is, for example, a pulse signal or a square signal. Because the second common node R2 is a short circuit, the first testing signal forms the combination signal on the second common node R2. In addition, the channel driver Dr of the testing channel CH_1 is not driven, the combination signal is sent back to the channel comparator Com of the first channel to be tested through the first target pad. Meanwhile, the channel comparator Com identifies and sends the receiving time information of the combination signal to the delay detector 400.

Meanwhile, the first testing signal outputted from the channel driver Dr of the testing channels CH_2~CH_K is also sent to the channel comparators Com of the testing channels CH_2~CH_K. The channel comparators Com of the testing channels CH_2~CH_K identify and send the receiving time information of the first testing signal to the delay detector 400. Therefore, the delay detector 400 calculates a first calibration value corresponding to the first channel to be tested according to the received receiving time information and the combination signal. Next, the delay detector 400 sends the first calibration value to the controlling device 100 to notify the controlling device 100 to calibrate reception delays of the testing channel CH_1 in the testing group G_1 according to the first calibration value.

When finishing the calibration of reception delays of the testing channel CH_1 in the testing group G_1, the controlling device 100 selects next testing channel as the first channel to be tested to perform calibration of reception delays until the calibrations of reception delays for all of the testing channels CH_1~CH_K in the testing group G_1 are finished as shown in the step S310, wherein the next testing channel is the testing channel CH_2. The calibrations of reception delays for the testing channels CH_2~CH_K in the testing group G_1 are similar to the calibration of reception delays for the testing channel CH_1 and are not further explained hereinafter.

When finishing the calibration of reception delays of the testing channels CH_1~CH_K in the testing group G_1, the automatic test equipment 10 further calibrates transmission delays of the testing channels CH_1~CH_K in the testing group G_1 as shown in steps S312~S320.

In the step S312, when the automatic test equipment 10 calibrates the testing group G_1, the controlling device 100 selects one of the testing channels CH_1~CH_K in the testing group G_1 as a second channel to be tested. In the step S314, a second testing signal is outputted from the second channel to be tested to the second common node R2 and a third testing signal is simultaneously outputted from other testing channels to the second common node R2. In the step S316, the second common node R2 sends back the reflection signal to the conductive pad corresponding to the second channel to be tested according to the second testing signal and the third testing signal. In the step S318, the delay detector 400 calculates a second calibration value corresponding to the second channel to be tested according to the sent reflection signal. In the step S320, the delay detector 400 sends the second calibration value to the controlling device 100 to notify the controlling device 100 to calibrate transmission delays of the second channel to be tested according to the second calibration value. The reflection signal is different from the second testing signal, and the second testing signal is different from the third testing signal.

For example, when the automatic test equipment 10 calibrates the testing group G_1, the controlling device 100 selects the testing channel CH_1 in the testing group G_1 as the second channel to be tested. Next, the controlling device 100 drives the channel driver Dr of the testing channels CH_2~CH_K to output the second testing signal to the plurality of second common nodes R2, such as setting the conductive pads P_2~P_K to low logic level to drive the channel driver Dr of the second channel to be tested to output the third testing signal to the plurality of second common nodes R2, wherein the third testing signal is, for example, a pulse signal. Because the second common node R2 is a short circuit, the third testing signal sent to the second common node R2 returns and forms the reflection signal. The reflection signal is, for example, the inverse signal of the third testing signal. Meanwhile, the channel comparator Com of the testing channel CH_1 receives the reflection signal to identify to and send the receiving time information of the reflection signal to the delay detector 400.

In addition, the channel comparators Com of the testing channels CH_2~CH_K also receive the second testing signal, and the channel comparator Com of the testing channel CH_1 also receives the third testing signal. The channel comparator Com of the testing channel CH_1 identifies and sends the receiving time information of the second testing signal to the delay detector 400, and the channel comparators Com of the testing channels CH_2~CH_K identify and send the receiving time information of the third testing signal to the delay detector 400. Next, the delay detector 400 calculates the second calibration value corresponding to the second channel to be tested according to the received receiving time information and the reflection signal. Next, the delay detector 400 sends the second calibration value to the controlling device 100 to notify the controlling device 100 to calibrate transmission delays of the second channel to be tested according to the second calibration value.

When finishing the calibration of transmission delays of the testing channel CH_1 in the testing group G_1, the controlling device 100 selects next testing channel as the second channel to be tested to perform calibration of transmission delays until the calibrations of transmission delays for all of the testing channels CH_1~CH_K in the testing group G_1 are finished as shown in the step S322, wherein the next testing channel is the testing channel CH_2. The calibrations of transmission delays for the testing channels CH_2~CH_K in the testing group G_1 are similar to the calibration of transmission delays for the testing channel CH_1 and are not further explained hereinafter.

When the automatic test equipment 10 finishes executing the steps S300~S322 for the first time, a first round of the first delay calibration procedure is finished. In the present embodiment or in other embodiments, the user is available to set the execution frequency of the first delay calibration procedure. When the execution frequency of the first delay calibration procedure does not reach a default frequency, the process goes back to the step S300 to perform next round of the first delay calibration procedure, that is, the process executes the steps S300~S322 until the execution frequency reaches the default frequency as shown in the step S324, so that the plurality of testing channels are more synchronized.

Figure 6:
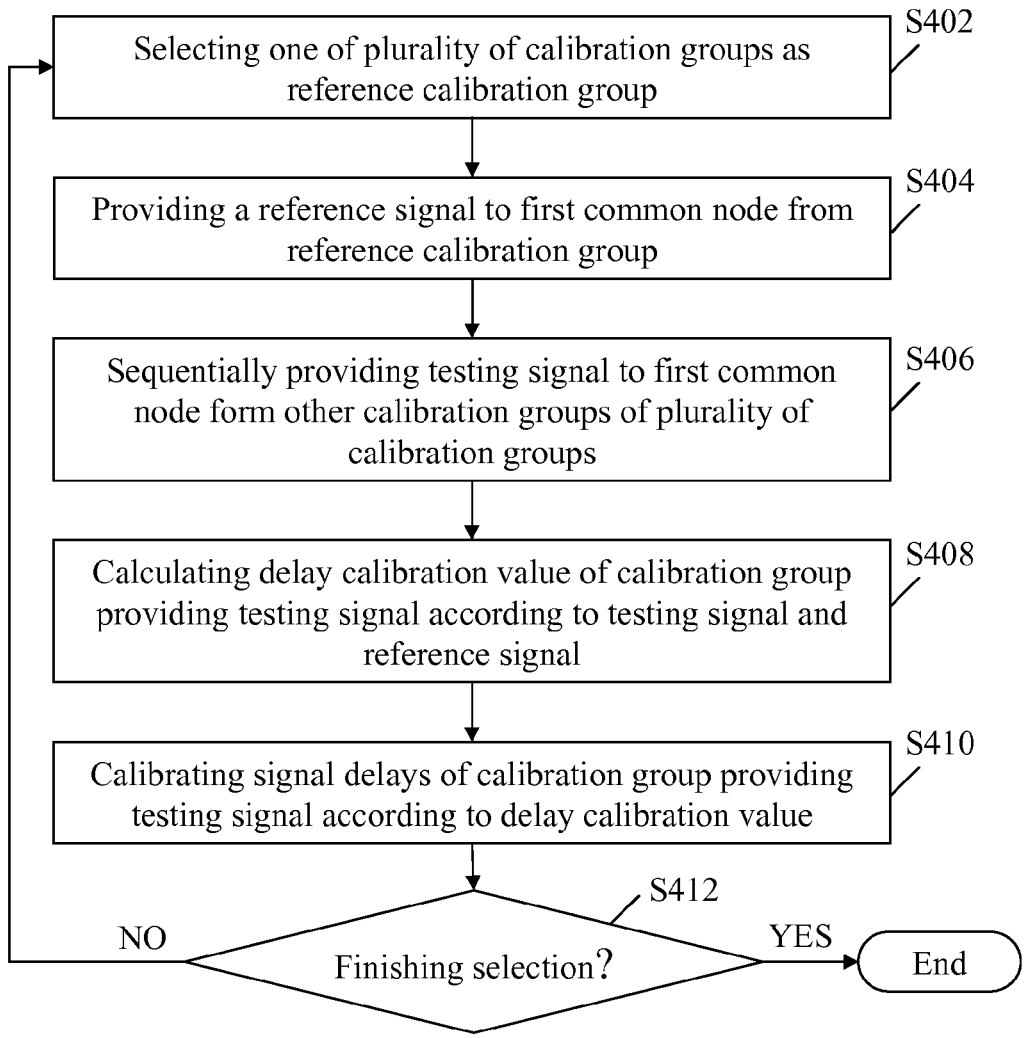
FIG. 6 is a flowchart of the second delay calibration procedure according to an embodiment.

Following the first delay calibration procedure in the step S100 in FIG. 3, in an embodiment of the step S200, the flowchart of the second delay calibration procedure is shown in FIG. 6. The second delay calibration procedure includes the following steps. In the step S402, the controlling device 100 selects one of the calibration groups G_1~G_N as a reference calibration group. Next, in the step S404, the controlling device 100 drives any of the plurality of testing channels in the calibration group to provide a reference signal to the first common node R1. In the step S406, the controlling device 100 selects one of the calibration groups G_1~G_N except the reference calibration group and drives any of the testing channels to provide a testing signal to the first common node R1. The delay detector 400 receives the testing signal and the reference signal through the first common node R1. In the step S408, the delay detector 400 calculates a delay calibration value of the calibration group providing the testing signal according to the testing signal and the reference signal. In the step S410, the controlling device 100 calibrates signal delays of the calibration group providing the testing signal.

For specifically explaining the second delay calibration procedure, the following example sequentially calibrates signal delays of each testing group according to the order of the testing groups G_1~G_N. Firstly, the controlling device 100 selects the calibration group G_1 from the calibration groups G_1~G_N as the reference calibration group. Next, the controlling device 100 drives any channel driver Dr of the calibration group G_1 to provide the reference signal to the first common node R1 and the corresponding channel comparator Com. The channel comparator Com identifies and sends the transmission time information of the reference signal to the delay detector 400. The delay detector 400 receives the reference signal through the first common node R1.

Next, the controlling device 100 selectively drives any channel driver Dr in the calibration group G_2 to provide the testing signal to the first common node R1 and the corresponding channel comparator Com. The channel comparator Com identifies and sends transmission time information of the testing signal to the delay detector 400. The delay detector 400 receives the testing signal through the first common node R1. The delay detector 400 calculates transmission delays between the calibration group G_1 and the calibration group G_2 as a delay calibration value to calibrate the calibration group G_2 according to the testing signal, the transmission time information of the testing signal, the reference signal, and the transmission time information of the reference signal. The delay detector 400 sends the delay calibration value to the controlling device 100 for calibrating signal delays of the testing channels CH_1~CH_K in the calibration group G_2 according to the delay calibration value.

When the calibrations of signal delays for the testing channels CH_1~CH_K in the calibration group G_2 are finished, the automatic test equipment 10 calibrates the next calibration group, that is, the automatic test equipment 10 calibrates the calibration group G_3 until all of the testing groups G_1~G_K are calibrated as shown in the step S412. The calibrations for the testing groups G_3~G_K are similar to the calibration of the calibration group G_2 and are not further explained hereinafter.

The calibration board and the timing calibration method of the present disclosure group the pins of the electronic device to be tested and the corresponding testing channels to form a plurality of calibration groups. Next, the first delay calibration procedure is performed to detect and calibrate signal delays of a plurality of testing channels in the same calibration group. The second delay calibration procedure is performed to detect and calibrate signal delays of the plurality of calibration groups. Therefore, transmission delays and reception delays of signal transmission in the plurality of testing channels are effectively calibrated or compensated and the costs of the switching modeling paths between each of the plurality of testing channels and the delay detector are reduced.

The foregoing description has been presented for purposes of illustration. It is not exhaustive and does not limit the disclosure to the precise forms or embodiments disclosed. Modifications and adaptations will be apparent to those skilled in the art from consideration of the specification and practice of the disclosed embodiments of the disclosure. It is intended, therefore, that the specification and examples be considered as exemplary only, with a true scope and spirit of the disclosure being indicated by the following claims and their full scope of equivalents.

What is claimed is:

1. An automatic test equipment comprising a delay detector, a controlling device and a calibration board pluggably disposed in the automatic test equipment for calibrating signal delays of a plurality of testing channels in the automatic test equipment, comprising:
    a first common node;
    a plurality of calibration groups, each of the plurality of calibration groups comprising:
        a second common node; and
        a plurality of conductive pads, each of the plurality of conductive pads electrically connected to the second common node and each of the plurality of conductive pads for being electrically connected to one of the plurality of testing channels selectively; and
    a switching module connected between the first common node and the plurality of second common nodes; and
    the delay detector electrically connected to the first common node and the plurality of testing channels;
    wherein the switching module disconnects connections between the first common node and the plurality of second common nodes when the controlling device electrically connected to the delay detector is performing a first delay calibration procedure; and
    the switching module builds connections between the first common node and the plurality of second common nodes when the controlling device is performing a second delay calibration procedure;
    wherein the delay detector is used for detecting signal delays between the electrically connected plurality of testing channels in the same calibration group in the first delay calibration procedure to synchronize the electrically connected plurality of testing channels in the same calibration group, and for detecting signal delays between the plurality of calibration groups in the second delay calibration procedure to synchronize the plurality of calibration groups.

2. The automatic test equipment of claim 1, wherein the switching module comprises a switch array and the switch array provides a plurality of switching paths, and each of the plurality of switching paths selectively builds an electrical connection between one of the plurality of second common nodes and the first common node.

3. The automatic test equipment of claim 2, wherein the switch array is a relay array.

4. A timing calibration method for an automatic test equipment, the automatic test equipment comprising a plurality of testing channels, a delay detector, a controlling device and a pluggable calibration board, the calibration board comprising a plurality of calibration groups, a first common node, and a switching module, and each of the plurality of calibration groups comprising a second common node and a plurality of conductive pads electrically connected to the second common node, each of the plurality of conductive pads electrically connected to one of the plurality of testing channels selectively, the switching module connected between the first common node and the plurality of second common nodes, the delay detector electrically connected to the first common node and the plurality of testing channels, the method comprising:
    when a first delay calibration procedure is performed by the controlling device electrically connected to the delay detector and the switching module disconnects connections between the first common node and the plurality of second common nodes, detecting signal delays between the plurality of testing channels in the same calibration group to synchronize the plurality of testing channels in the same calibration group; and
    when a second delay calibration procedure is performed by the controlling device and the switching module builds connections between the first common node and the plurality of second common nodes, detecting signal delays between the plurality of calibration groups to synchronize the plurality of calibration groups;
    wherein the delay detector is used for detecting signal delays between the electrically connected plurality of testing channels in the same calibration group in the first delay calibration procedure to synchronize the electrically connected plurality of testing channels in the same calibration group, and for detecting signal delays between the plurality of calibration groups in the second delay calibration procedure to synchronize the plurality of calibration groups.

5. The timing calibration method of claim 4, wherein the first delay calibration procedure comprises:
    sequentially detecting and calibrating reception delays of the plurality of testing channels according to a combination signal, wherein the combination signal is generated from a first testing signal provided by part of the plurality of testing channels; and
    sequentially detecting and calibrating transmission delays of the plurality of testing channels according to a reflection signal, wherein the reflection signal is generated from a second testing signal provided by the testing channel to be calibrated.

6. The timing calibration method of claim 5, wherein the step of sequentially detecting and calibrating reception delays of the plurality of testing channels according to a combination signal comprises:
  selecting one of the plurality of testing channels one by one as a first channel to be tested;
  simultaneously outputting the first testing signal to the second common node from other testing channels of the plurality of testing channels to generate the combination signal;
  sending the combination signal back to the conductive pad corresponding to the first channel to be tested from the second common node;
  calculating a first calibration value corresponding to the first channel to be tested according to the combination signal and a receiving time information of the combination signal; and
  calibrating reception delays of the first channel to be tested according to the first calibration value.

7. The timing calibration method of claim 5, wherein the step of sequentially detecting and calibrating transmission delays of the plurality of testing channels according to a reflection signal comprises:
  selecting one of the plurality of testing channels one by one as a second channel to be tested;
  simultaneously outputting the second testing signal to the second common node from the second channel to be tested and outputting a third testing signal to the second common node from other testing channels of the plurality of testing channels, wherein the second testing signal is different from the third testing signal;
  sending the reflection signal back to the conductive pad corresponding to the second channel to be tested from the second common node according to the second testing signal and the third testing signal, wherein the reflection signal is different from the second testing signal;
  calculating a second calibration value corresponding to the second channel to be tested according to the reflection signal and a receiving time information of the reflection signal; and
  calibrating transmission delays of the second channel to be tested according to the second calibration value.

8. The timing calibration method of claim 4, wherein the second delay calibration procedure comprises:
  selecting one of the plurality of calibration groups as a reference calibration group;
  providing a reference signal to the first common node from the reference calibration group;
  sequentially providing a testing signal to the first common node form other calibration groups of the plurality of calibration groups;
  calculating a delay calibration value of the calibration group providing the testing signal according to the testing signal and the reference signal; and
  calibrating signal delays of the calibration group providing the testing signal according to the delay calibration value.

* * * * *